Nov. 24, 1964 H. NELSON ETAL 3,158,512

SEMICONDUCTOR DEVICES AND METHODS OF MAKING THEM

Filed May 14, 1962 2 Sheets-Sheet 1

INVENTORS
HERBERT NELSON &
CARL W. BENYON, JR.

BY W.S. Hill
AGENT

INVENTORS
HERBERT NELSON &
CARL W. BENYON, JR.
BY W. S. Hill
AGENT 3,158,512

SEMICONDUCTOR DEVICES AND METHODS OF MAKING THEM

Herbert Nelson, Princeton, and Carl W. Benyon, Jr., Trenton, N.J., assignors to Radio Corporation of America, a corporation of Delaware Filed May 14, 1962, Ser. No. 194,466
3 Claims. (Cl. 148—1.5)

This invention relates to semiconductor devices, and more particularly, to an improved method of fabricating improved semiconductor junction devices.

The area of the rectifying barrier or junction in a semiconductor device may be limited, as in point contact and line contact semiconductor devices. Alternatively, the barrier may be of broad area. Broad area devices include grown junction devices, diffused junction devices, and surface alloyed junction devices.

Grown junctions may be formed by melting a quantity of given conductivity type semiconductor material, contacting the surface of the melt with a crystal of the same material but of opposite conductivity type, and slowly withdrawing the seed so that a portion of the melt freezes on the seed.

Diffused junctions may be formed by heating a semiconductive body in vapors of a conductivity type-determining substance, or in a liquid such as a molten salt or a molten solvent metal containing a dissolved conductivity type determining material, which may be either an acceptor or a donor.

Surface alloyed or fused junctions may be formed by heating an assemblage consisting of an electrode pellet in contact with a semiconductive wafer. The pellet consists of or contains a conductivity type-determining substance such as an acceptor or a donor. Alternatively, instead of pressing a solid impurity pellet on a semiconductive wafer and heating the assemblage until the pellet melts and fuses to the wafer, a molten mass of an impurity-yielding material may be allowed to a selected portion of the surface of a body of crystalline semiconductive material, as described in U.S. Patent 2,839,341, assigned to the same assignee as that of the present appilcation.

Variations and modifications have been made in the above techniques. It is also known to treat a wafer of monocrystalline semiconductive material such as germanium, silicon, germanium-silicon alloys, and the like so as to deposit a thin layer of the same semiconductive material on one major face of the wafer. For example, a stream of hydrogen and germanium chloride is heated and passed over a germanium wafer, so that the germanium chloride is reduced and germanium is deposited on the wafer. Epitaxy causes the semicmonductive material which is deposited on the wafer to assume the same crystal lattice structure as the substrate wafer. The semiconductive material thus deposited in the same lattice as the wafer is known as an epitaxial layer, and is generally of the order of 1 to 50 microns in thickness. The epitaxial layer may be deposited along with a conductivity type modifier such as an acceptor or a donor, so that the epitaxial layer is of conductivity type opposite to that of the wafer, and a junction is formed between them. Alternatively, the epitaxial layer formed may be intrinsic, or may be of the same conductivity type as the wafer, but of either greater or lesser electrical resistivity.

For some device applications, it is desirable to form a junction within the thin epitaxial layer itself. However, because the epitaxial layer is so thin, this has been found difficult to accomplish. Some techniques for junction formation, such as growing junctions on a seed, are not applicable for this purpose. Other techniques, such as surface alloying, or diffusion techniques, are very difficult to control within such close limits as are required in epitaxial layers. It is also desirable to have the junction cover the entire area of the epitaxial layer. Furthermore, it is desirable that the junction formed be planar. These objectives have been very difficult to attain, particularly within an epitaxial layer.

Accordingly, it is an object of this invention to provide a new and improved method of forming rectifying barriers in semiconductor devices.

Another object is to provide an improved method of making large area junctions.

Still another object is to provide an improved method of making planar junctions.

But another object is to provide an improved method of making large area planar junctions at a controlled depth within a semiconductor body.

These and other objects of the invention are accomplished by preheating a semiconductor wafer having an exposed major face, and preparing a charge comprising a semiconductive material, a conductivity modifier which is an acceptor in the said semiconductive material, a conductivity modifier which is a donor in the aforesaid material, and a solvent capable of dissolving the semiconductive material. The solvent is selected from the group of metals and metallic alloys which are electrically neutral with respect to the semiconductive material. The acceptor modifier and the donor modifier are selected to have differential solubilities in the solid semiconductive material. The solubility of one modifier in the solid semiconductive material decreases rapidly with decreasing temperature, while the solubility of the other modifier in the solid semiconductive material decreases slowly with decreasing temperature. The two modifiers are present in the charge in unequal amounts. The modifier having a solubility which decreases rapidly with decreasing temperature is in excess of the amount of the other modifier present. The charge is separately preheated to a temperature above the melting point of the charge but below the melting point of the wafer. Next, the exposed face of the heated wafer is flooded with the molten charge. The molten charge and the wafer are then cooled, so that a portion of the semiconductive material dissolved in the charge precipitates from the charge and recrystallizes on the exposed wafer face. The first recrystallized portion of semiconductive material contains dissolved therein both of the conductivity modifiers present in the charge, but the one modifier present in excess in the charge (which has the solubility decreasing more rapidly with decreasing tempearture) is present in excess in the first recrystallized portion.

As the cooling of the molten charge and wafer is continued, additional charge material precipitates and continues to build up the recrystallized layer. Although the later deposited material contains both conductivity type modifiers, at a certain point in the cooling cycle, the other modifier begins to predominate over the first mentioned modifier, and this later deposited material will therefore be of conductivity type opposite that of the initially deposited portion. Although the build-up of recrystallized material is continuous and the only demarcation between them is a P-N junction which is due to the changeover from one conductivity type to opposite conductivity type, for convenience of designation, the earlier deposited material will be referred to herein as a "first recrystallized portion" and the later deposited material will be referred to as a "second recrystallized portion." The remainder of the molten charge is then decanted from the wafer.

The invention is described in greater detail with reference to the accompanying drawing, in which.

Two examples of the fabrication of semiconductor devices illustrate the method of forming rectifying barriers in an epitaxial layer in accordance with this invention. However, it is to be understood that the conductivity type of the various wafers and zones may be reversed, and that other crystalline semiconductors such as silicon, germanium-silicon alloys and semiconductive compounds such as silicon carbide, the phosphides, arsenides and antimonides of aluminum, gallium and indium and the sulfides, selenides and tellurides of zinc and cadmium may be utilized as the semiconductive wafer, with appropriate acceptor-donor combinations in each case.

*Example I*

Figure 1:
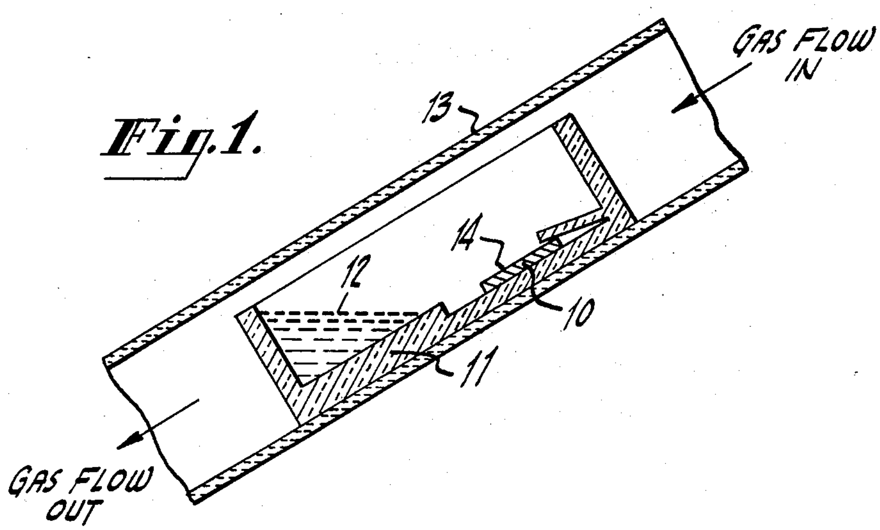
FIGURE 1 is a schematic drawing of apparatus useful in the practice of the invention.

Referring to FIGURE 1 of the drawing, a semiconductor wafer 10 of germanium is inserted in the bottom of one end of a refractory furnace boat 11 so as to expose one major face of the wafer. The wafer 10 may be of any convenient size, and may be either P-type or N-type or intrinsic. The boat 11 has means such as a double bottom to secure the wafer with one major face 14 exposed, and may, for example, be made of graphite or the like. A charge 12 is introduced into the opposite end of boat 11. In this example, the charge 12 consists of 8 grams of granulated germanium, about 0.1 gram of indium, about .0002 gram of arsenic, and, as solvent 75 grams of lead and 4 grams of tin. The boat 11 is then placed in a refractory furnace tube 13, which may suitably consist of quartz, and the tube 13 is tilted so that charge 12 is kept separate from wafer 10. In order to maintain a non-oxidizing atmosphere around the wafer and the charge, the furnace tube 13 is swept with a reducing gas such as a mixture of 9 volumes nitrogen and 1 volume hydrogen. Alternatively, pure hydrogen or an inert gas such as nitrogen or helium may be utilized as the furnace ambient.

The charge 12 and wafer 10 are preheated to a temperature above the melting point of the solvent metals included in the charge, but below the melting point of the semiconductor wafer. In this example, the preheating temperature is about 600° C., which is sufficient for the solvent metals lead and tin to melt and dissolve the charge semiconductor, which in this example is germanium, and the donor and acceptor modifiers in the charge, which in this example are arsenic and indium. The molten charge is allowed to cool to about 560° C. The furnace tube 13 is then brought to a horizontal position so that the exposed face 14 of wafer 10 is flooded with the molten charge. Cooling of the furnace and its contents is allowed to continue. A first portion of the dissolved germanium is precipitated from the molten charge and grows epitaxially onto the flooded major face 14 of the semiconductor wafer 10. Since the amount of indium in the molten charge is considerably in excess of the amount of arsenic present, and the solubility of indium in germanium is relatively high at high temperatures, the first portion 31 (FIGURE 3*b*) of the charge germanium to recrystallize on wafer 10 contains a considerable excess of indium acceptor atoms over arsenic donor atoms. Accordingly, the first portion 31 of the epitaxial layer on wafer 10 is P-type. The epitaxial layer continues to grow in thickness while the temperature of the furnace decreases to 360° C. at a rate of about 10° C. per minute. During this cooling step, the arsenic present in the charge enters the crystal lattice of the epitaxial layer at a nearly constant rate, but the indium present in the molten charge enters the epitaxial layer at a rapidly decreasing rate. The difference in behavior of these two conductivity type modifiers may be seen in FIGURE 2, wherein the variation of solubility with temperature for indium and arsenic in solid germanium is plotted. It will be seen that the solubility of indium in germanium decreases with decreasing temperature at a relatively rapid rate, while the solubility of arsenic in germanium decreases very slowly with decreasing temperature.

Figure 2:
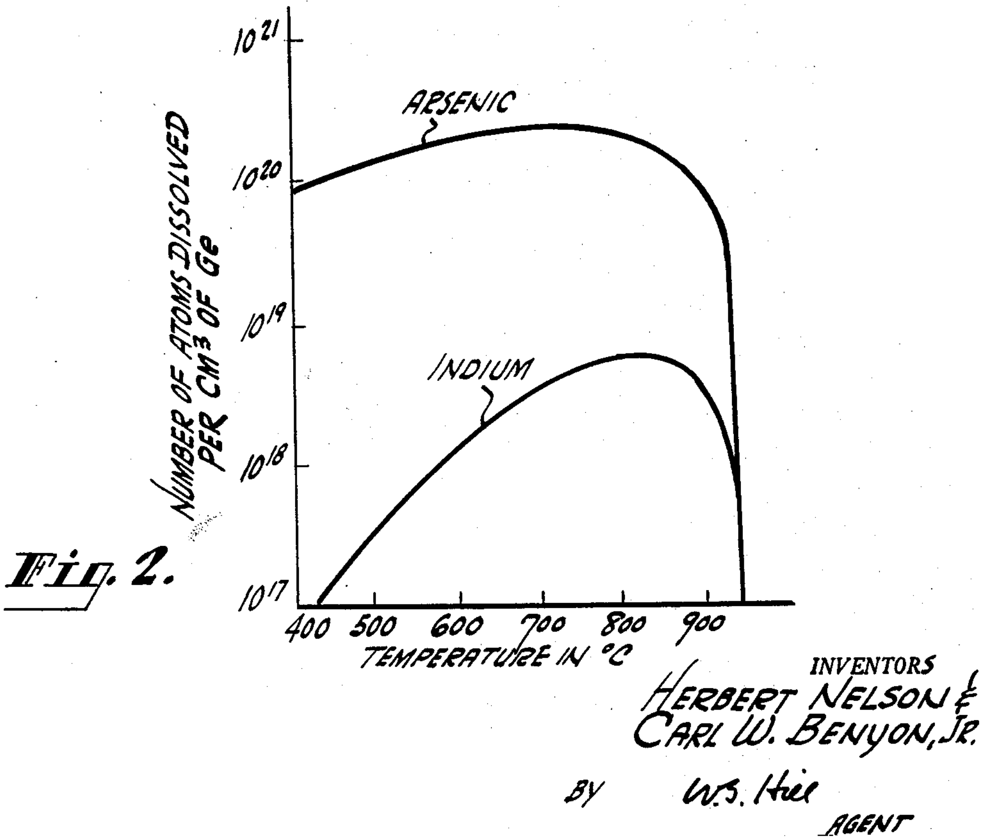
FIGURE 2 is a graph showing the temperature variation of solubility in solid germanium for a particular acceptor modifier and a particular donor modifier; and, FIGURES 3*a*–3*f* are cross-sectional views showing successive steps in the fabrication of a semiconductor junction device according to the invention.

As the cooling of the wafer 10 and the molten charge 12 continues, a "second portion" 33 (FIGURE 3*c*) of the germanium dissolved in the charge precipitates and grows epitaxially onto the "first portion." However, since this second portion 33 is precipitated at a lower temperature than the first portion, the amount of indium which dissolves therein is decreased considerably as compared to the amount of indium in the first portion 31 of the epitaxial layer. In contrast, the amount of arsenic dissolved in the second recrystallized portion of the epitaxial layer is decreased only slightly as compared to the amount of arsenic in the first recrystallized portion, since, as seen in the graph of FIGURE 2, the solubility of arsenic in germanium decreases slowly with decreasing temperature. Accordingly, the second portion 33 of the charge germanium to recrystallize on wafer 10 contains an excess of arsenic donor atoms over indium acceptor atoms, and hence portion 33 of the epitaxial layer is N-type. A rectifying barrier known as a P-N junction 32 (FIGURE 3*c*) is thus formed in the epitaxial layer between the first recrystallized portion 31 and the second recrystallized portion 33. The P-N junction 32 thus formed is planar, and extends over the entire originally exposed face 14 of the semiconductor wafer 10. The relative thickness of the recrystallized portions 31 and 33 has been exaggerated in the drawing for greater clarity. Although the first recrystallized portion 31 and the second recrystallized portion 33 are shown for convenience as distinct layers in the drawing, it will be understood that there is really only one epitaxial layer formed on wafer 10, and that this epitaxial layer contains throughout both indium acceptor atoms and arsenic donor atoms, but the indium acceptor atoms are present in excess in the first formed portion 31 of the epitaxial layer, while the arsenic donor atoms are present in excess in the second formed portion 33 of the epitaxial layer, so that a P-N junction 32 exists in the transition region between them.

The method of the invention may be utilized to fabricate a semiconductor junction device, as illustrated in FIGURES 3*a* to 3*f* of the drawing. For example, as semiconductor wafer 10 consisting of mono-crystalline germanium may be prepared with two opposed major faces 14 and 16, as shown in FIGURE 3. In this example, wafer 10 is composed of $P^+$ type germanium, that is, of germanium having a relatively high concentration of acceptors, and has resistivity of about 0.0008 ohm-cm. Wafer 10 is treated with a molten charge of germanium, arsenic, indium, lead and tin as described above in connection with FIGURE 1 to form an epitaxial deposit on one major face 14 of the wafer. The first recrystallized portion 31 of the deposit is P-type, for the reasons discussed above. Under these conditions, the epitaxial germanium P-type portion 31 has a resistivity of about 0.3 ohm-cm. As explained previously, the second recrystallized portion 33 of the epitaxial layer is N-type, and a rectifying barrier or P-N junction 32 is formed in the transition region between these two portions.

Figures 3A, 3B, 3C, 3D, 3E, 3F:
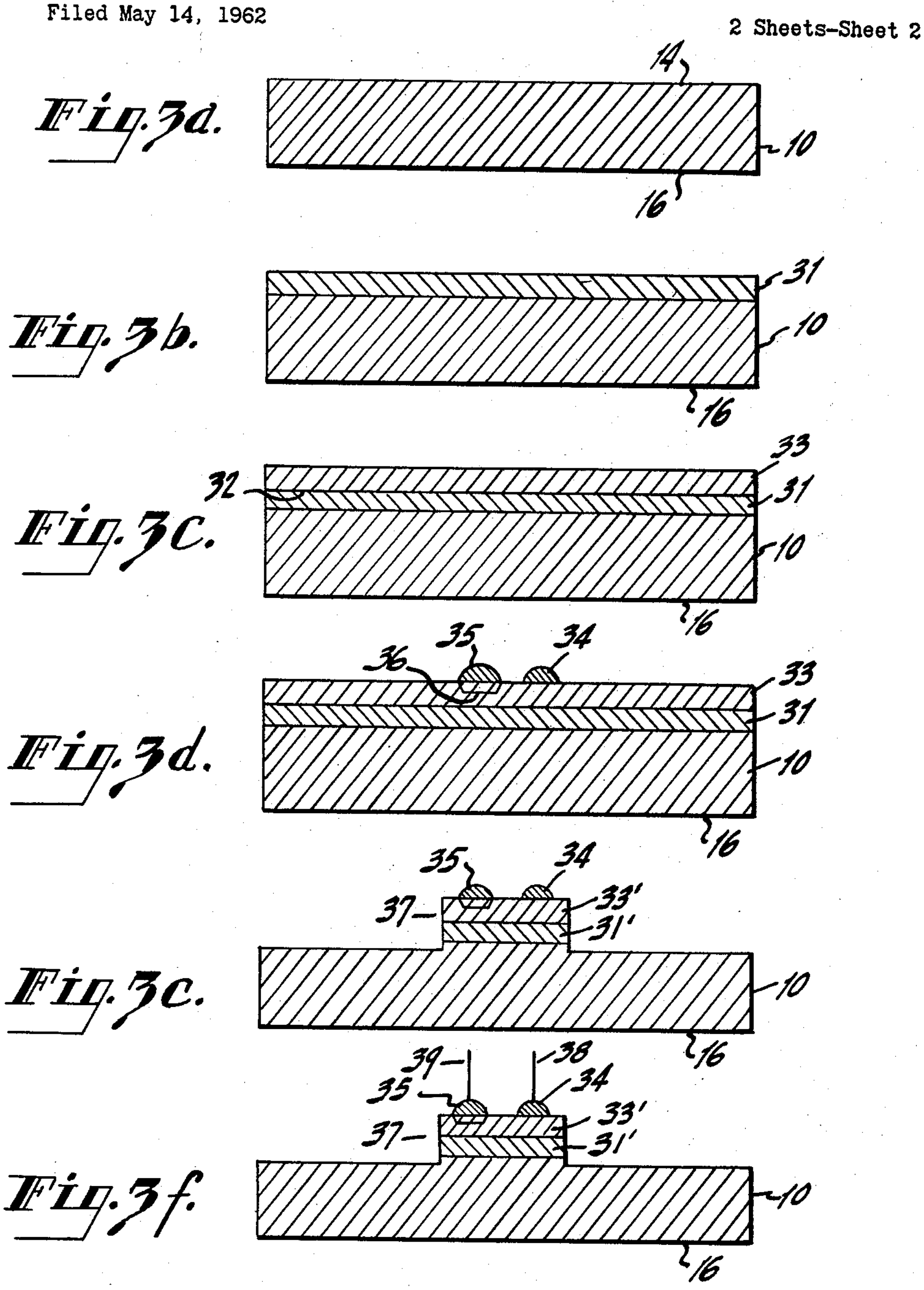

An ohmic contact is made to the N-type portion 33 of the epitaxial deposit by alloying thereto an electrode pellet 34, as illustrated in FIGURE 3*d*. In this example, electrode pellet 34 consists of 99 weight percent lead-1 weight percent antimony. A rectifying contact to the N-type region 33 is made closely adjacent to electrode 34 by alloying an indium electrode pellet 35 to the N-type region 33. The techniques for alloying electrode pellets are known to the art, and by alloying at low temperatures for shorter periods of time, the depth of penetration of electrode pellet 35 is reduced, so that pellet 35 does not alloy all the way through N-type zone 33. A rectifying barrier 36 is formed between the indium electrode pellet 35 and the N-type zone 33.

Next, major wafer face 16 and that portion of the opposing wafer face 14 on which electrode pellets 34 and 35 are formed are masked with an acid resist such as wax, and wafer 10 is etched so as to remove the unmasked portions of the epitaxial layers 31 and 33. The acid resist (not shown) is then removed by an appropriate solvent, leaving wafer 10 as illustrated in FIGURE 3*e* with pellets 34 and 35 and face 16 intact. The remaining portion of the epitaxial deposit forms a mesa.

A lead wire 38 is attached to the ohmic electrode 34, and a lead wire 39 is attached to the rectifying electrode 35, as shown in FIGURE 3*f*. The unit is then encapsulated and cased by methods known to the art. The electrical connection to the collector region 31 is made by way of wafer face 16. The device thus fabricated is a P-N-P mesa type triode, and is suitable for operation at high frequencies.

*Example II*

The method of the invention may also be utilized when the epitaxial layer consists of semiconductive material different from the material of the semiconductor wafer itself, provided that the wafer material and the material in the epitaxial layer have the same crystal lattice structure, and have similar lattice constants. In this example, the semiconductor wafer 10 consists of monocrystalline gallium arsenide, and may be of either conductivity type. The semiconductive material in charge 12 consists of germanium. The charge also includes indium, arsenic, lead and tin in the same proportions utilized in Example I above. The charge 12 and wafer 10 are positioned in a furnace boat 11 and separately preheated in a tilted furnace tube 13 to about 600° C., as described in Example I and illustrated in FIGURE 1. The furnace tube 13 is then brought to a horizontal position, so that an exposed major face 14 of wafer 10 is flooded by the molten charge. As the wafer and the charge are permitted to cool, a first portion 31 (FIGURE 3*b*) of the germanium dissolved in the charge is precipitated from the molten charge. Since germanium and gallium arsenide have the same crystal lattice structure and similar lattice constants, the precipitated germanium deposits on wafer 14 as an extension of the wafer crystal lattice. This first portion 31 is P-type for the reasons discussed above. Cooling is continued to precipitate a second portion 33 (FIGURE 3*c*) of germanium from the molten charge. This second portion 33 is N-type as described above in Example I, so that a P-N junction 32 is formed between the epitaxial layers 31 and 33. In this manner, semiconductor devices may be fabricated having zones of different energy gap and different conductivity type.

Various modifications and variations may be made without departing from the spirit and scope of the invention. For example, other crystalline semiconductive materials may be utilized as the substrate wafer and in the charge, and other combinations of acceptors, donors, and solvent metals, subject to the proviso that the solvent be electrically neutral with respect to the semiconductive materials, and that the solubility of one member of the acceptor and donor materials pair decreases in the charge semiconductive material with decreasing temperature at a more rapid rate than the other member of the acceptor and donor pair.

What is claimed is:

1. The method of introducing a rectifying barrier in an epitaxial layer of semiconductive material on a crystalline semiconductive wafer, comprising the steps of (*a*) preheating said semiconductive wafer while exposing one major face thereof;

(*b*) preparing a charge comprising a semiconductive material, a solvent capable of dissolving said material, said solvent being selected from the group of metals and alloys which are electrically neutral with respect to said material, a conductivity modifier which is an acceptor in said material, a conductivity modifier which is a donor in said material, said acceptor modifier and said donor modifier having differential solubilities in said material, the solubility of one said modifier in said material decreasing rapidly with decreasing temperature, while the solubility of the other said modifier in said material decreases slowly with decreasing temperature, the amount of said one modifier present in said charge being in excess of the amount of said other modifier present;

(*c*) separately preheating said charge to a temperature above the melting point of said charge but below the melting point of said semiconductive wafer;

(*d*) flooding said exposed face of said heated wafer with the molten charge;

(*e*) cooling said molten charge and said wafer so that a first portion of said semiconductive material in said charge precipitates from said charge and recrystallizes on said exposed wafer face as an epitaxial layer, said first recrystallized portion having dissolved therein both said conductivity modifiers, said one modifier being present in excess in said first recrystallized portion;

(*f*) continuing to cool said molten charge so that a second portion of said semiconductive material in said charge precipitates from said charge and recrystallizes on said exposed wafer face, said second recrystallized portion having dissolved therein both said conductivity modifiers, said other modifier being present in excess in said second recrystallized portion, thereby forming a rectifying barrier within said epitaxial layer between said first and second portions;

(*g*) and decanting the remainder of said molten charge.

2. The method of introducing a rectifying barrier in an epitaxial layer of semiconductive material on a crystalline semiconductive wafer, comprising the steps of (*a*) preheating said semiconductive wafer while exposing one major face thereof;

(*b*) preparing a charge comprising a solvent capable of dissolving said wafer, said solvent being selected from the group of metals and alloys which are electrically neutral with respect to said wafer, a conductivity modifier which is an acceptor in said wafer, a conductivity modifier which is a donor in said wafer, and some of the same semiconductive material of which said wafer is composed, said acceptor modifier and said donor modifier having differential solubilities in said semiconductive wafer, the solubility of one said modifier in said wafer decreasing rapidly with decreasing temperature, while the solubility of the other said modifier in said wafer decreases slowly with decreasing temperature, said one modifier which has a rapidly decreasing solubility being present in said charge in excess over the amount of said other modifier which has a slowly decreasing solubility;

(*c*) separately preheating said charge to a temperature above the melting point of said charge but below the melting point of said semiconductive wafer;

(*d*) flooding said exposed face of said heated wafer with the molten charge;

(*e*) cooling said molten charge and said wafer so that a portion of said semiconductive material in said charge precipitates from said charge and recrystallizes on said exposed wafer face, as an epitaxial layer, said first recrystallized portion having dissolved therein both said conductivity modifiers, said one modifier which has a rapidly decreasing solubility being present in excess in said first recrystallized portion;

(*f*) continuing to cool said molten charge so that a second portion of said semiconductive material in said charge precipitates from said charge and recrystallizes on said exposed wafer face, said second recrystallized portion having dissolved therein both said conductivity modifiers, said other modifier which has a slowly decreasing solubility being present in excess in said second recrystallized portion, thereby forming a rectifying barrier within said epitaxial layer between said first and second portions;

(*g*) and decanting the remainder of said molten charge.

3. The method of introducing a rectifying barrier in an epitaxial layer of semiconductive material on a crystalline germanium wafer, comprising the steps of (*a*) preheating said wafer while exposing one major face thereof;

(*b*) preparing a charge consisting of lead, tin, germanium, arsenic and indium, the amount of said indium present in said charge being in excess of the amount of arsenic present;

(*c*) separately preheating said charge to a temperature above the melting point of said charge but below the melting point of said wafer;

(*d*) flooding said exposed face of said heated wafer with the molten charge, (*e*) cooling said molten charge and said wafer so that a portion of said germanium in said charge precipitates from said charge and recrystallizes on said exposed wafer face as an epitaxial layer, said first recrystallized portion having dissolved therein both indium and arsenic, the amount of indium present in said first recrystallized portion being in excess of the amount of arsenic present;

(*f*) continuing to cool said molten charge so that an additional portion of said germanium in said charge precipitates from said charge and recrystallizes on said exposed wafer face, said second recrystallized portion having dissolved therein both indium and arsenic, the amount of arsenic present in said second recrystallized portion being in excess of the amount of indium present in said second portion, thereby forming a rectifying barrier within said epitaxial layer between said first and second portions;

(*g*) and decanting the remainder of said molten charge.

References Cited in the file of this patent

UNITED STATES PATENTS

| | | |
|---|---|---|
| 2,822,309 | Hall | Feb. 4, 1958 |
| 2,950,219 | Pohl | Aug. 23, 1960 |
| 2,977,256 | Lesk | Mar. 28, 1961 |
| 2,988,464 | Jones | June 13, 1961 |

OTHER REFERENCES

O'Rourke et al.: "Electrical Properties of Vapor-Grown Ge Junctions," IBM Journal, vol. 4, No. 3, July 1960, page 257.

"Radio Corporation of America RCA Laboratories," vol. 6, August-September 1960, pages 19–22.